(12) United States Patent
Schelling

(10) Patent No.: US 9,178,018 B2
(45) Date of Patent: Nov. 3, 2015

(54) MANUFACTURING METHOD FOR A MICROMECHANICAL COMPONENT AND A CORRESPONDING MICROMECHANICAL COMPONENT

(71) Applicant: Christoph Schelling, Stuttgart (DE)

(72) Inventor: Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 17 days.

(21) Appl. No.: 14/098,879

(22) Filed: Dec. 6, 2013

(65) Prior Publication Data
US 2014/0159209 A1   Jun. 12, 2014

(30) Foreign Application Priority Data
Dec. 6, 2012   (DE) .......................... 10 2012 222 426

(51) Int. Cl.
| | |
|---|---|
| *H01L 21/302* | (2006.01) |
| *H01L 29/06* | (2006.01) |
| *H01L 29/04* | (2006.01) |
| *B81C 1/00* | (2006.01) |
| *H01L 21/306* | (2006.01) |

(52) U.S. Cl.
CPC ........ *H01L 29/0684* (2013.01); *B81C 1/00047* (2013.01); *B81C 1/00515* (2013.01); *H01L 29/045* (2013.01); *B81B 2201/0257* (2013.01); *H01L 21/30608* (2013.01); *H04R 2201/003* (2013.01)

(58) Field of Classification Search
CPC .............. H01L 29/0684; H01L 29/045; H01L 21/2633
USPC .......................................... 257/622; 438/705
See application file for complete search history.

(56) References Cited

U.S. PATENT DOCUMENTS

| | | | | |
|---|---|---|---|---|
| 5,165,289 | A | * | 11/1992 | Tilmans ..................... 73/862.59 |
| 5,332,469 | A | | 7/1994 | Mastrangelo |
| 6,651,506 | B2 | | 11/2003 | Lee et al. |
| 6,787,052 | B1 | * | 9/2004 | Vaganov ......................... 216/57 |
| 7,514,287 | B2 | | 4/2009 | Huang et al. |
| 2006/0183330 | A1 | | 8/2006 | Abraham et al. |
| 2010/0038734 | A1 | | 2/2010 | Kasai et al. |
| 2011/0095387 | A1 | * | 4/2011 | Carey et al. ................... 257/431 |
| 2011/0163079 | A1 | | 7/2011 | Ito |
| 2011/0309458 | A1 | | 12/2011 | Gamage et al. |

FOREIGN PATENT DOCUMENTS

| | | |
|---|---|---|
| DE | 197 00 290 | 7/1998 |
| DE | 100 04 964 | 8/2001 |
| DE | 102008001952 | 11/2009 |

* cited by examiner

*Primary Examiner* — Trung Q Dang
(74) *Attorney, Agent, or Firm* — Kenyon & Kenyon LLP

(57) ABSTRACT

A manufacturing method is described for a micromechanical component and a corresponding micromechanical component. The manufacturing method includes the steps: forming at least one crystallographically modified area in a substrate; forming an etching mask having a mask opening on a main surface of the substrate; and carrying out an etching step using the etching mask, the crystallographically modified area and a surrounding area of the substrate being removed and thus forming a cavern in the substrate.

12 Claims, 4 Drawing Sheets

MANUFACTURING METHOD FOR A MICROMECHANICAL COMPONENT AND A CORRESPONDING MICROMECHANICAL COMPONENT

FIELD OF THE INVENTION

The present invention relates to a manufacturing method for a micromechanical component and a corresponding micromechanical component.

BACKGROUND INFORMATION

A method for separating a substrate into multiple single components is described in U.S. Published Patent Appln. No. 2011/0163079 and German Published Patent Appln. No. 10 2008 001 952, in which the crystal structure is modified along a separation line with the aid of a pulsed laser beam in the depth of a monocrystalline substrate, which is also denoted as stealth dicing or Mahoh dicing.

Wet chemical methods for the production of crystallographically determined caverns have already been in production for many years; however, severe limitations exist in this area, which affects the design of the cavern shape. Known crystallographic etching methods may in particular only be used for implementing caverns having precisely predefined geometries (flank angles) and sizes. In part, the cavern sizes limit the component size and thus prevent miniaturization. In the case of silicon methods, the etching of caverns using KOH as an etching medium is well-known. In the case of a (100)-surface orientation, this generally results in a rectangular pyramid or a truncated pyramid in a preselected etching time.

In addition, in the case of all known etching methods, in particular also in the case of DRIE, the diaphragm dimensions of the cavern on the opposite substrate side are strongly correlated with the thickness of the wafer, since the etching mask is lithographically defined on the rear side in the case of a fixed flank etching angle of the cavern.

FIGS. 4a, b are schematic cross-sectional representations for elucidating an exemplary manufacturing method for a micromechanical component and a corresponding micromechanical component for elucidating the present invention.

In FIG. 4a, reference symbol 1a denotes a first wafer having a thickness $d_a$, a mask opening MA of an etching mask (not shown) being defined on its rear side R. If a diaphragm M1a having a predetermined thickness d is etched in wafer 1a through mask opening MA on side V, the lateral dimension of diaphragm M1a is indicated as MMa. This dimension results due to etching flank angle α.

If, however, according to FIG. 4b, a thicker wafer 1b having a thickness $d_b$ having an identical mask opening MA is etched on the rear side in order to form a diaphragm M1b having thickness d, its diaphragm dimension MMb is smaller than diaphragm dimension MMa because etching flank angle α is identical.

A combined etching method from a DRIE etching and a subsequent KOH etching is described in U.S. Pat. No. 7,514,287, which makes it possible to produce caverns having a waist greater than the etching opening.

SUMMARY

The present invention provides a manufacturing method for a micromechanical component and a corresponding micromechanical component.

The present invention provides a manufacturing method for a micromechanical component with the aid of a combination of structure-changing methods, e.g., a laser method, and an etching method, e.g., a wet etching method which is selective for crystallographic direction, such as a KOH etching method. The manufacturing method according to the present invention makes it possible to manufacture caverns having aspect ratios which deviate from the crystallographically predefined ratios.

The idea underlying the present invention is that in a first processing step in a volume area of a substrate, the crystal structure is modified, so that in a later etching step, it exhibits a changed etching behavior compared to the surroundings of the volume area. If the modified crystal volume lies at a depth in which it is reached by an etch through a mask opening in combination with the natural flank angles, it is possible to achieve completely novel cavern geometries or caverns in the form of buried channels which were previously not possible using known methods.

The cavern dimensional tolerance is substantially lower than in known pure DRIE etching or KOH etching, and in particular if the modification, e.g. by fusing, takes place from the substrate side. Caverns having virtually arbitrary aspect ratios and shapes may be manufactured using the method according to the present invention.

Of particular advantage is an increase of the possible size of rear volumes in caverns in the case of small chip dimensions and adequately stable chip frames, for example, in the case of micromechanical microphones.

According to one preferred specific embodiment, at least one crystallographically modified area is formed using a laser treatment step, in which the area is fused and cooled. This makes it possible to modify a precisely defined volume area of the substrate.

According to another preferred specific embodiment, the at least one crystallographically modified area is formed using a particle irradiation step. For example, an ion implantation method is suitable for this purpose.

According to another preferred specific embodiment, the area is modified in such a way that the area is at least partially amorphous or polycrystalline. This makes it possible to increase the etching sensitivity locally.

According to another preferred specific embodiment, the etching step is a wet etching step, in particular using KOH or TMAH or EDP as an etching medium. This makes it possible to implement geometrically regular cavern shapes. Using a wet etching step of this type also makes it possible to achieve a cost-effective batch processability.

According to another preferred specific embodiment, multiple crystallographically modified areas are formed in the interior of the substrate, the crystallographically modified areas and particular surrounding areas of the substrate being removed in the etching step. This makes it possible to form caverns which have a shape of a virtual superposition of multiple partial caverns.

According to another preferred specific embodiment, the main surface is the rear side of the substrate, the etching step being carried out in such a way that a diaphragm area is formed on the side of the substrate. This makes it possible, for example, to design micromechanical microphones having a large rear volume.

According to another preferred specific embodiment, the substrate is monocrystalline. This makes it possible to produce crystallographically differentiated etching structures of the cavern.

According to another preferred specific embodiment, the substrate is a (100)-silicon substrate, the cavern having, at least in areas, the shape of a truncated octahedron having (111)-oriented main surfaces.

DETAILED DESCRIPTION

Identical reference symbols in the figures denote identical elements or elements having an identical function.

Figure 1A:
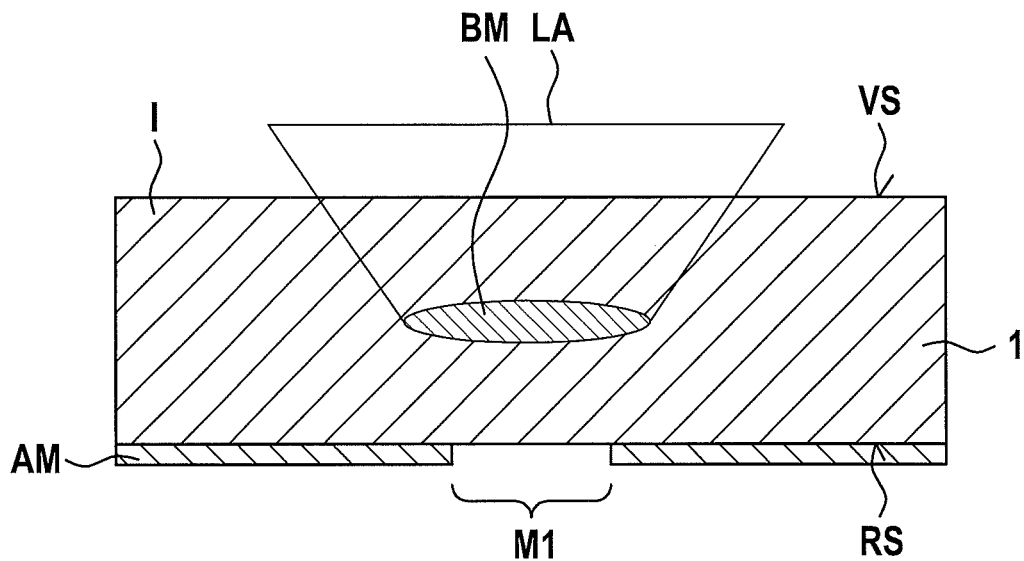
FIGS. 1a-c show schematic cross-sectional representations for elucidating a manufacturing method for a micromechanical component and a corresponding micromechanical component according to a first specific embodiment of the present invention.
Figure 1B:
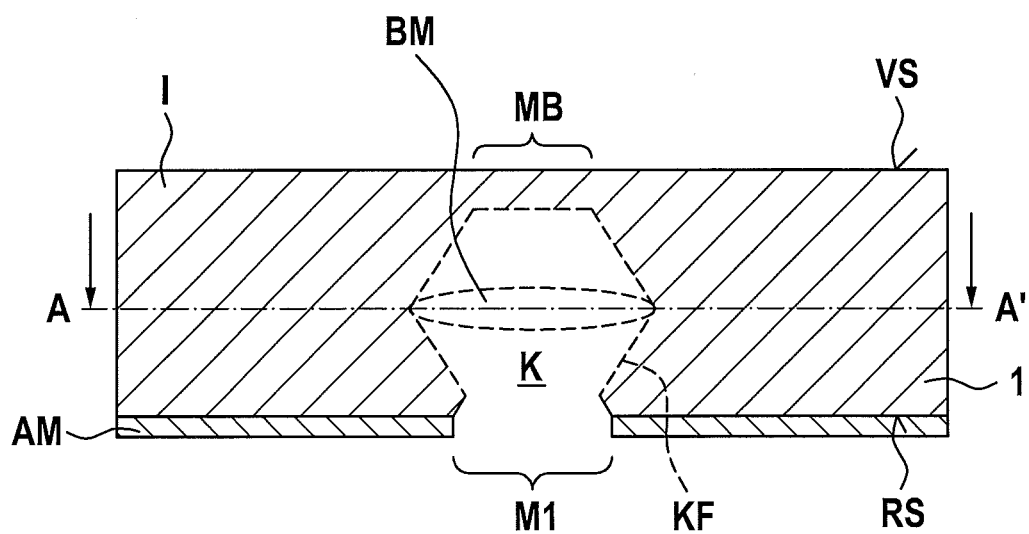
Figure 1C:
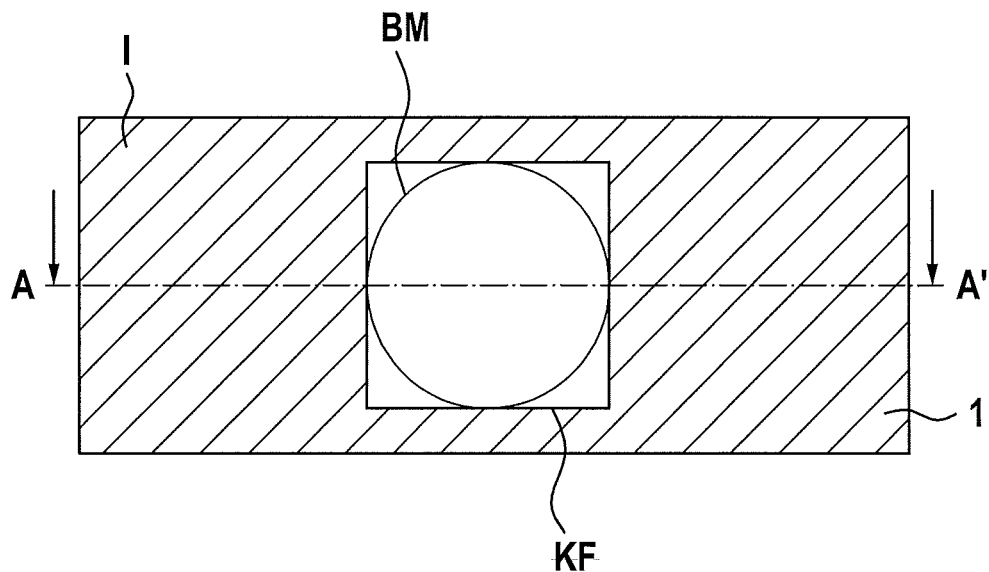

FIGS. 1a through c are schematic cross-sectional representations for elucidating a manufacturing method for a micromechanical component and a corresponding micromechanical component according to a first specific embodiment of the present invention.

With reference to FIG. 1a, reference numeral 1 denotes a monocrystalline silicon substrate having a side VS and a rear side RS. In interior I of silicon substrate 1, a crystallographically modified area BM is produced from side VS by a laser treatment step LA. A brief selective input of a high dose of energy is carried out in laser treatment step LA, which fuses the substrate in area BM. If area BM is subsequently cooled sufficiently rapidly, a crystallographically modified amorphous or partially amorphous or polycrystalline volume area is produced, which exhibits a changed etching behavior compared to its monocrystalline substrate surroundings.

An etching mask AM having a mask opening M1 is formed on rear side RS of silicon substrate 1, mask opening M1 being oriented to modified area BM.

With further reference to FIG. 1b, a KOH etching step is then carried out using etching mask AM having mask opening M1, crystallographically modified area BM and a surrounding area of silicon substrate 1 being removed, resulting in the production of a cavern K in silicon substrate 1. Cavern K virtually surrounds earlier modified area BM, which is indicated by the dashed line in FIG. 1b. Modified area BM is removed as soon as the etch mold reaches it, accelerated due to the absence of long-range crystal planes without the formation of permanently crystal-oriented etch fronts.

Cavern K is delimited by slowest etching crystal facets KF, which in the case of a (100)-silicon substrate 1 using KOH as the etching medium, would be a truncated octahedron having (111)-oriented main surfaces or crystal facets KF. A diaphragm area MB is formed on side VS of silicon substrate 1 above the cavern in the example shown.

It also ensues here that the tolerances of the diaphragm dimension of diaphragm area MB may be limited in that modified area BM originates from side VS, while the crystallographic etching process originates from rear side RS. The diaphragm dimensions in this case are only determined by the size of modified area BM. The thickness of silicon substrate 1 no longer plays a role. However, the requirement exists in this case that the side layers are adequately transparent for the selected laser radiation.

FIG. 1c shows a horizontal cross section along line A-A' of FIG. 1b.

Figure 2:
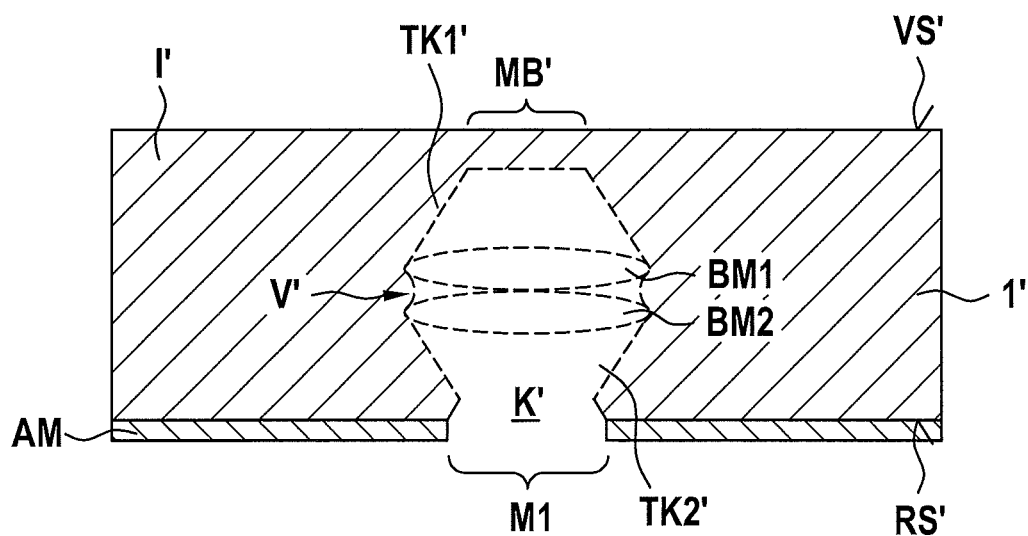
FIG. 2 shows a schematic cross-sectional representation for elucidating a manufacturing method for a micromechanical component and a corresponding micromechanical component according to a second specific embodiment of the present invention.

FIG. 2 is a schematic cross-sectional representation for elucidating a manufacturing method for a micromechanical component and a corresponding micromechanical component according to a second specific embodiment of the present invention.

Silicon substrate 1' of this second specific embodiment has a side VS' and a rear side RS'. The diaphragm area formed on side VS' by the etching is denoted by reference symbol MB'.

According to FIG. 2, two superposed modified areas BM1, BM2 are produced, as described above, using a laser treatment step LA prior to the etching in interior I' of silicon substrate 1', the modified areas having roughly the same size and being in contact with one another laterally. If the KOH etching step is then carried out, similar to Figure 1b, it is possible to manufacture a cavern K', which is a virtual superposition of two partial caverns TK1', TK2'. In this connection, a stricture area V lies between partial caverns TK1', TK2'.

Figure 3:
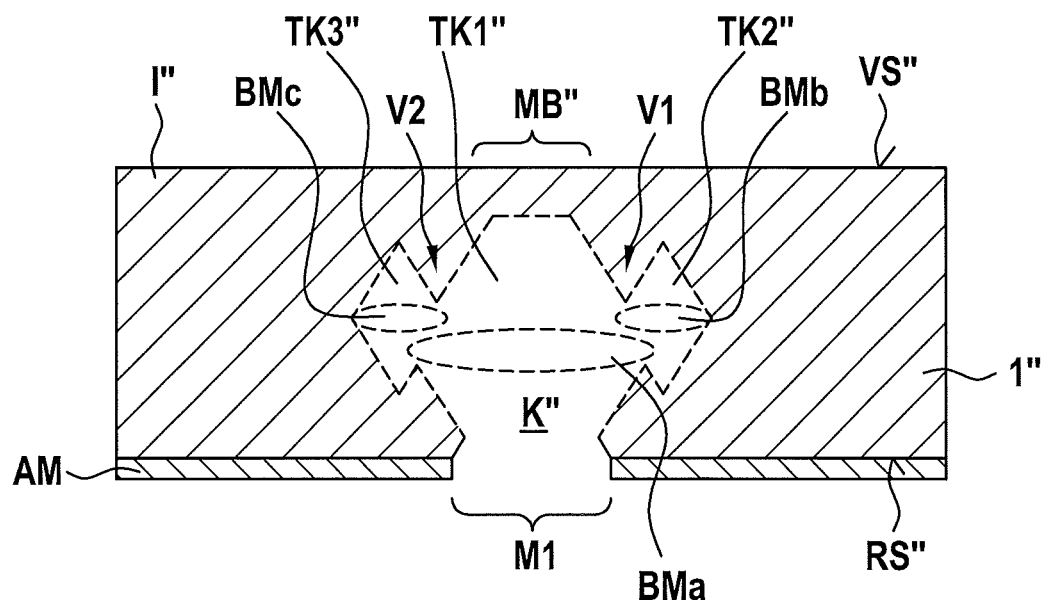
FIG. 3 shows a schematic cross-sectional representation for elucidating a manufacturing method for a micromechanical component and a corresponding micromechanical component according to a third specific embodiment of the present invention.
Figure 4A:
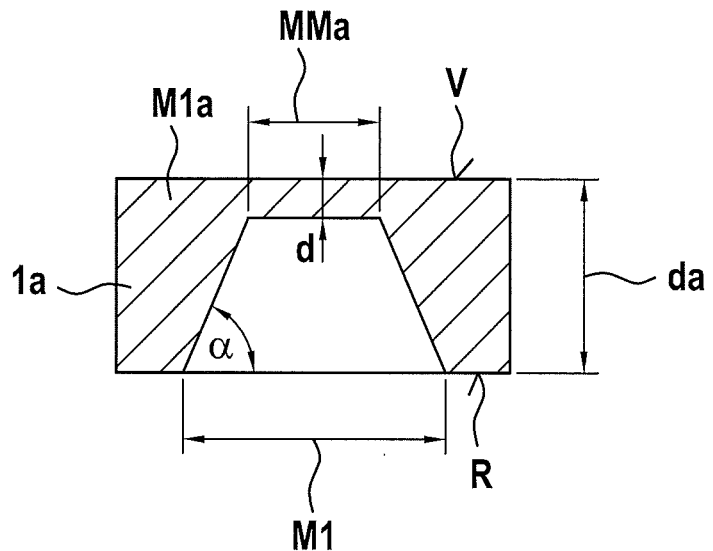
FIGS. 4a, b show schematic cross-sectional representations for elucidating an exemplary manufacturing method for a micromechanical component and a corresponding micromechanical component for elucidating the present invention.
Figure 4B:
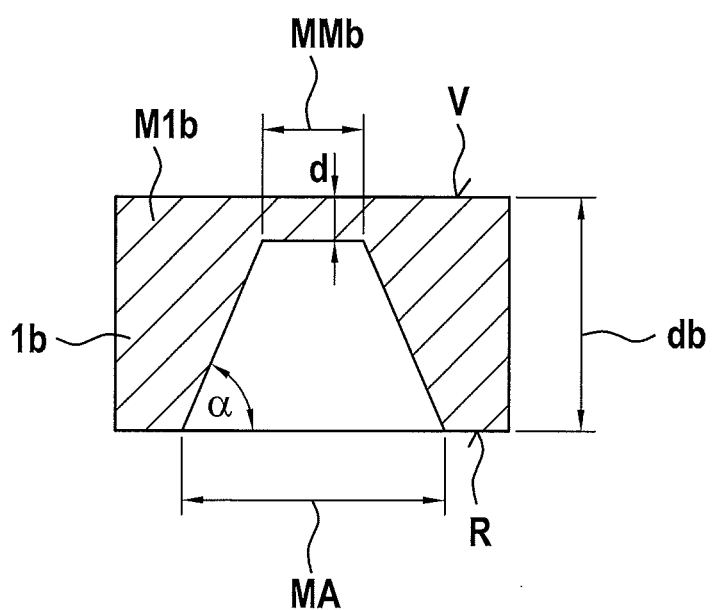

FIG. 3 is a schematic cross-sectional representation for elucidating a manufacturing method for a micromechanical component and a corresponding micromechanical component according to a third specific embodiment of the present invention.

Silicon substrate 1" of this third specific embodiment has a side VS" and a rear side RS". The diaphragm area formed on side VS" by the etching is denoted by reference symbol MB".

In the case of the third specific embodiment, three modified areas BMa, BMb and BMc are formed in interior I" of silicon substrate 1" prior to the etching, and specifically by above-described laser treatment step LA. First modified area BMa is oriented toward mask opening M1, whereas the two smaller modified areas BMb, BMc are situated offset to it on the left or right side above first modified area BMa. This thus makes it possible, in the KOH etching step, to produce a cavern K" having diaphragm area MB" lying above it, which may be considered to be a superposition of three partial caverns TK1", TK2" and TK3". A first stricture area V1 lies between partial caverns TK1" and TK2", and a second stricture area V2 lies between partial caverns TK1" and TK3".

Although the present invention was described above completely based on preferred exemplary embodiments, it is not limited thereto, but instead may be modified in a variety of ways. In particular, the provided materials are only exemplary and not restrictive.

Although the modified area is an area located isolated in the interior of the substrate in the above-described exemplary embodiments, this area may, if necessary, also extend to the side or rear side of the substrate in other specific embodiments.

Although the modified area or modified areas is/are formed using the described laser treatment method in the case of the above-mentioned specific embodiments, the present invention is not limited thereto, but instead, for example, other electromagnetic irradiation methods or particle irradiation methods may also be used for the modification.

The etching method is also not limited to the described KOH etching method, but instead other wet etching methods or dry etching methods may also be used.

What is claimed is:
1. A manufacturing method for a micromechanical component, comprising:

forming at least one crystallographically modified area in a substrate such that the crystallographically modified area is at least partially amorphous or polycrystalline;

forming an etching mask having a mask opening on a main surface of the substrate; and carrying out an etching step using the etching mask such that the crystallographically modified area and a surrounding area of the substrate are removed, resulting in a cavern formed in the substrate.

2. The manufacturing method as recited in claim 1, wherein the at least one crystallographically modified area is formed using a laser treatment step, in which the at least one crystallographically modified area is fused and cooled.

3. The manufacturing method as recited in claim 1, wherein the at least one crystallographically modified area is formed using a particle irradiation step.

4. The manufacturing method as recited in claim 1, wherein the etching step is a wet etching step.

5. The manufacturing method as recited in claim 4, wherein the wet etching step uses one of KOH, TMAH, and EDP as an etching medium.

6. The manufacturing method as recited in claim 1, wherein multiple crystallographically modified areas are formed in the substrate (1; 1'; 1"), and wherein the crystallographically modified areas and surrounding areas of the substrate are removed.

7. The manufacturing method as recited in claim 1, wherein the main surface is a rear side of the substrate, and wherein the etching step is carried out in such a way that a diaphragm area is formed on a front side of the substrate.

8. The manufacturing method as recited in claim 1, wherein the substrate is monocrystalline.

9. A manufacturing method for a micromechanical component, comprising:

forming at least one crystallographically modified area in a substrate;

forming an etching mask having a mask opening on a main surface of the substrate;

carrying out an etching step using the etching mask; and removing the crystallographically modified area and a surrounding area of the substrate being removed, resulting in a cavern formed in the substrate;

wherein the substrate is a monocrystalline (100)-silicon substrate, and wherein, at least in areas, the cavern has a shape of a truncated octahedron having (111)-oriented main surfaces.

10. The manufacturing method as recited in claim 1, wherein the at least one crystallographically modified area is formed in a volume area in the interior of the substrate.

11. The manufacturing method as recited in claim 1, wherein the etching step is selective for crystallographic direction.

12. The manufacturing method as recited in claim 11, wherein the etching mask is situated in relation to the at least one crystallographically modified area such that the at least one cystallographically modified area is reached by an etching front through the mask opening in combination with natural flank angles, wherein the at least one crystallographically modified area and the surrounding area of the substrate are removed, resulting in the cavern formed in the substrate.

* * * * *